(12) United States Patent
Lanois

(10) Patent No.: US 7,078,783 B2
(45) Date of Patent: Jul. 18, 2006

(54) VERTICAL UNIPOLAR COMPONENT

(75) Inventor: Frédéric Lanois, Tours (FR)

(73) Assignee: STMicroelectronics S.A., Montrouge (FR)

( * ) Notice: Subject to any disclaimer, the term of this patent is extended or adjusted under 35 U.S.C. 154(b) by 264 days.

(21) Appl. No.: 10/767,568

(22) Filed: Jan. 29, 2004

(65) Prior Publication Data

US 2004/0183115 A1 Sep. 23, 2004

(30) Foreign Application Priority Data

Jan. 30, 2003 (FR) .............................. 03 01077

(51) Int. Cl.
*H01L 27/095* (2006.01)
*H01L 29/47* (2006.01)
*H01L 29/812* (2006.01)
*H01L 31/07* (2006.01)
*H01L 31/108* (2006.01)

(52) U.S. Cl. ................. 257/483; 257/475; 257/481; 257/486; 257/603

(58) Field of Classification Search ............... 257/471, 257/475, 476, 481, 483, 485, 486, 603, 605, 257/606
See application file for complete search history.

(56) References Cited

U.S. PATENT DOCUMENTS

| 5,540,977 | A | 7/1996 | Vogelsang et al. |
| 6,707,128 | B1 * | 3/2004 | Moriguchi et al. ......... 257/484 |
| 2001/0000033 | A1 | 3/2001 | Baliga |
| 2002/0074578 | A1 | 6/2002 | Hshieh et al. |

FOREIGN PATENT DOCUMENTS

| EP | 1 170 803 A2 | 1/2002 |
| WO | WO 02/13257 A2 | 2/2002 |

OTHER PUBLICATIONS

French Search Report from French Patent Application 03/01077, filed Jan. 30, 2003.
Patent Abstracts of Japan, vol. 013, No. 128 (E–735), Mar. 29, 1989 & JP 63 296282 A (Sony Corp.).

* cited by examiner

*Primary Examiner*—Ngân V. Ngô
(74) *Attorney, Agent, or Firm*—Lisa K. Jorgenson; James H. Morris; Wolf, Greenfield & Sacks, P.C.

(57) ABSTRACT

A vertical unipolar component formed in a semiconductor substrate. An upper portion of the substrate includes insulated trenches filled with a vertical multiple-layer of at least two conductive elements separated by an insulating layer, the multiple-layer depth being at most equal to the thickness of the upper portion.

11 Claims, 3 Drawing Sheets

# VERTICAL UNIPOLAR COMPONENT

BACKGROUND OF THE INVENTION

1. Field of the Invention

The present invention relates to the manufacturing of vertical unipolar components in monolithic form. The following description more specifically aims, as an example only, at the case of components of Schottky diode type made in vertical form in silicon substrates.

2. Discussion of the Related Art

FIG. 1 illustrates a conventional structure of a Schottky diode. The structure comprises a heavily-doped semiconductor substrate ($N^+$) 1, typically made of single-crystal silicon. A cathode layer ($N^-$) 2 more lightly doped than substrate 1 covers substrate 1. A metal layer 3 forms a Schottky contact with cathode 2 and forms the diode anode. The contour of anode 3 is defined by an insulator 4.

FIG. 1 also illustrates, in dotted lines, a distribution of equipotential surfaces V1, V2, V3, V4, and V5 in cathode 2 upon reverse biasing at a voltage V5. Equipotential surfaces V1 to V5 are equidistant, the intermediary equipotential surfaces V1 to V4 corresponding to increasing fractions of voltage V5 (V1=V5/5, V2=2V5/5, V3=3V5/5, V4=4V5/5). Equipotential surfaces V1 to V5 distribute in homogeneous fashion in cathode 2 and exhibit an area of strong curvature at the periphery of Schottky junction 2-3.

The forming of such unipolar components comes up against two opposite constraints. They must exhibit the smallest possible on-state resistance (Ron) while having a high breakdown voltage.

Minimizing the on-state resistance requires minimizing the thickness of the less heavily-doped layer (layer 2) and maximizing the doping of this layer.

On the contrary, to obtain a high reverse breakdown voltage, the doping of layer 2 must be minimized and its thickness must be maximized, while avoiding creating areas in which the equipotential surfaces are strongly curved.

Various solutions have been provided to reconcile such opposite constraints. The structure and operation of two of these solutions will be briefly described hereafter in relation with FIGS. 2 and 3.

In the structure of FIG. 2, vertical doped regions (P) 20 are formed in a cathode layer (N) 21 more lightly doped than an underlying substrate ($N^+$) 22. Regions 20 extend across the thickness of cathode 21 from its upper surface. A metal layer 23 covers the entire structure, forming a Schottky contact with cathode 21 and also contacting the upper surface of regions 20. The dimensions and the doping of regions 20 are selected so that the amount of dopants of all regions 20 is equal to the amount of dopants of opposite type present in the portions of the part of cathode 21 separating regions 20. If the width of regions 20 is equal to the interval separating them, their doping is equal to the doping of layer 21.

In reverse biasing, the portions of layer 21 separating two regions 20 progressively deplete from Schottky interface 21-23 and from P-N interface 20-21. When these portions are completely depleted, the assembly of cathode 21 and of regions 20 substantially behaves as an almost intrinsic layer of zero doping. FIG. 2 illustrates in dotted lines the distribution of equidistant equipotential surfaces V11, V12, V13, V14, and V15 upon reverse biasing at a value V15. Equipotential surfaces V11 to V15 are homogeneously distributed and are substantially planar. Thus, the doping of layer 21 may be increased while providing an optimal breakdown voltage.

However, such a structure is complex to manufacture. Indeed, to ensure the necessary control of the dimensions and doping of regions 20, said regions are formed by implantation upon epitaxial growth of cathode layer 21. To form deep vertical regions 20 with a substantially homogeneous doping, masking, implantation, and epitaxy steps must be repeated.

In the structure of FIG. 3, conductive areas ($N^+$) 30, for example made of heavily-doped N-type polysilicon, are formed in an upper portion of a thick layer (N) 31 less heavily N-type doped than an underlying substrate ($N^+$) 32. An insulating layer 33 insulates areas 30 from layer 31. A metal anode 34 covers the entire structure, contacting the upper surface of areas 30 and forming a Schottky contact with cathode 31.

In reverse biasing, insulated areas 30 cause a lateral depletion of layer 31, which modifies the equipotential surface distribution in layer 31 with respect to the distribution in homologous layer 2 of FIG. 1. This enables increasing the doping of layer 31 with respect to the doping of layer 2, and thus reducing the on-state resistance with no adverse effect on the reverse breakdown voltage.

FIG. 3 illustrates in dotted lines the distribution of equidistant equipotential surfaces V21 to V25 upon reverse biasing at a value V25. Equipotential surfaces V21 to V25 are homogeneously distributed in cathode 31, but avoid areas 30 by passing, partly, through insulating layer 33. The equipotential surfaces corresponding to the highest voltages then exhibit significant curvatures at the level of the angles of layer 33, and a breakdown will occur first at these locations.

For a given on-state resistance, the reverse breakdown voltage will thus be smaller with the structure of FIG. 3 than with the structure of FIG. 2. In practice, despite their limited performances, it is however preferred to use such structures, since they are easier to manufacture than those of FIG. 2. It is indeed possible to form by epitaxy cathode 31 in a single step, then dig trenches, coat them with insulating layer 33, and fill them with the conductive material.

SUMMARY OF THE INVENTION

The present invention aims at a unipolar component structure which overcomes the disadvantages of known structures, that is, which has both the advantage of a high breakdown voltage of the structure of FIG. 2 and the advantage of the manufacturing simplicity of the structure of FIG. 3.

To achieve these and other objects, the present invention provides a vertical unipolar component formed in a semiconductor substrate, in which an upper portion of the substrate comprises insulated trenches filled with a vertical multiple-layer of at least two conductive elements separated by an insulating layer, the multiple-layer depth being at most equal to the thickness of said upper portion.

According to an embodiment of the present invention, the multiple-layer depth is equal to the thickness of the upper portion, the insulating layer also separating the elements of a substrate portion underlying the upper portion.

According to an embodiment of the present invention, at least part of the elements are conductive grains.

According to an embodiment of the present invention, at least part of the elements are blocks exhibiting, in top view, a same surface area as the multiple-layer.

According to an embodiment of the present invention, the component is a Schottky diode having its cathode corresponding to said upper portion.

The present invention also provides a method for manufacturing a vertical unipolar component in a semiconductor substrate, comprising the steps of:

a) digging at least one vertical trench into an upper portion of the substrate;

b) coating the lateral walls and the bottom of the trench with an insulating layer;

c) depositing and etching a first conductive layer to partially fill the trench;

d) coating the remaining portion of the first conductive layer with an insulating layer; and e) depositing and etching a second conductive layer to fill the trench.

According to an embodiment of the present invention, the sequence of steps c) and d) is repeated.

The foregoing objects, features, and advantages of the present invention will be discussed in detail in the following non-limiting description of specific embodiments in connection with the accompanying drawings.

DETAILED DESCRIPTION

Figure 1:
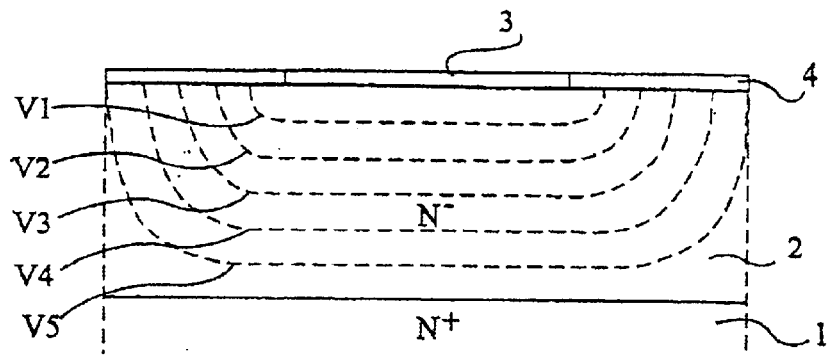
FIG. 1, previously described, is a partial simplified cross-section view of a conventional unipolar component.

For clarity, the same elements have been referred to with the same reference numerals in the different drawings. Further, as usual in semiconductor component representation, the drawings are not to scale.

Figure 4:
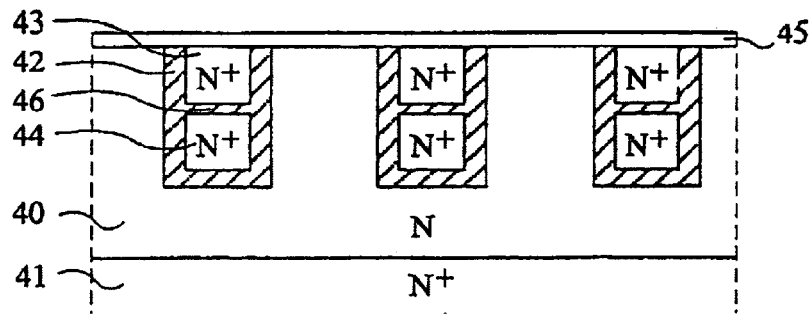
FIG. 4 is a partial simplified cross-section view of an embodiment of a unipolar component according to the present invention.

FIG. 4 is a partial simplified cross-section view of an embodiment of a Schottky diode according to the present invention. The cathode of the diode is an upper portion (N) 40 of a semiconductor substrate, for example made of single-crystal silicon. A lower portion (N$^+$) 41 of the substrate forms a contact area of the cathode. Cathode 40 is more lightly doped than portion 41.

In cathode 40 are formed trenches coated with an insulator 42 and filled with a conductor divided in two conductive elements, a high element 43 and a low element 44 separated by an insulating layer 46. It will be said hereafter that insulated conductor elements 43-44 form a multiple-layer. The upper surface of high element 43 is coplanar with the upper surface of peripheral cathode 40 and is also in contact with an anode metallization 45 forming a Schottky contact with cathode 40.

Figure 5A:
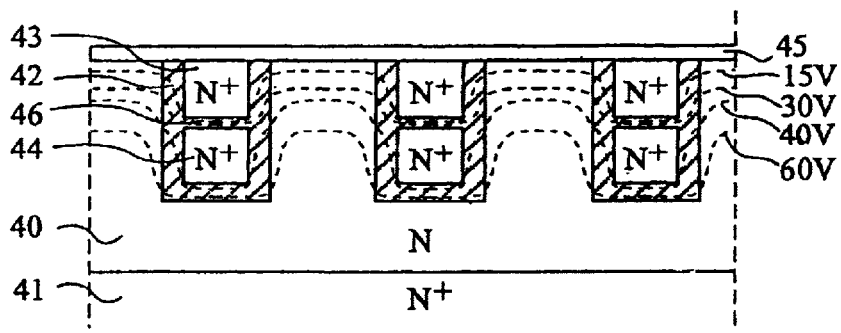
FIG. 5A to 5B are partial simplified cross-section views illustrating the operation in reverse biasing of a component according to the present invention.
Figure 5B:
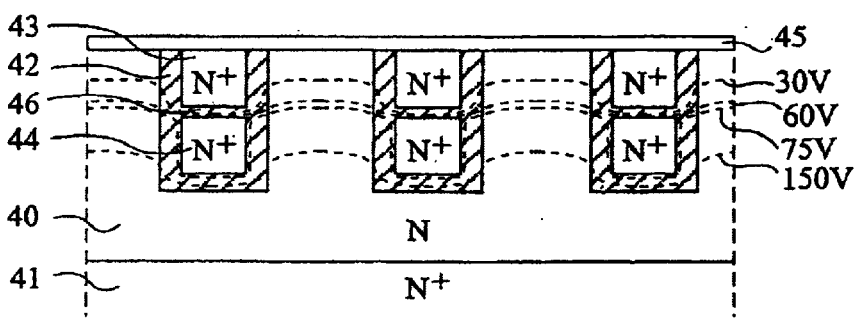

The operation of a component according to the present invention is discussed hereafter in relation with FIGS. 5A and 5B.

FIGS. 5A and 5B illustrate, in a partial simplified cross-section view, the equipotential surface distribution in the diode of FIG. 4 for respective reverse biasings of 60 and 150 V. In FIG. 5A, the course of the equipotential surfaces at 15, 30, 40, and 60 V has been shown. In FIG. 5B, the course of the equipotential surfaces at 30, 60, 75, and 150 V has been shown.

When the structure is reverse biased (by the application of a positive voltage on the cathode, for example, the anode remaining at 0 V), the voltage applied between cathode and anode creates an intermediary voltage on the floating electrode by capacitive coupling. The more the voltage between cathode and anode is increased and the more the voltage of the floating electrode increases. For a given thickness of oxide layer 46, the voltage of the floating electrode corresponds to a relatively constant percentage of the voltage applied between the anode and the cathode.

The higher the oxide thickness, the higher this percentage. As a result, when the oxide thickness is very high, very few equipotential surfaces pass under low element 44, and again there is a very strong curvature at the bottom corner of high element 43, which results in a premature breakdown (the problem of structure 3).

Conversely, if the thickness of oxide layer 46 is strongly reduced, a very low percentage is obtained, which translates the fact that the equipotential surfaces pass in majority under low element 44. A strong curvature then appears again at the bottom corner of the low element, which results in a premature breakdown.

There thus exists a thickness of layer 46 which optimizes the breakdown voltage of the structure. This thickness can be determined simply by those skilled in the art, for example, by simulation. Layer 46 then enables reducing the field by a good separation of the equipotential surfaces. This results in an improvement of the breakdown voltage for an otherwise equivalent structure (doping, epitaxy . . . ).

An example of a method for manufacturing a unipolar component according to the present invention is described hereafter in relation with FIGS. 6A to 6E in the case of a vertical monolithic Schottky diode similar to that of FIG. 4.

Figure 6A:
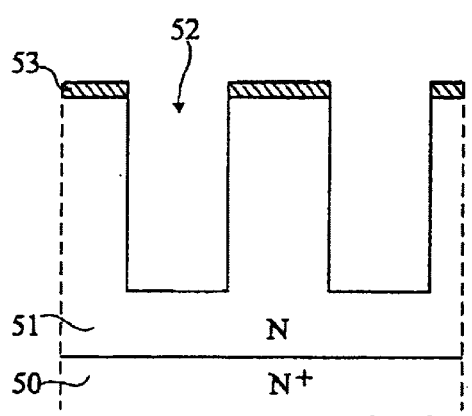
FIGS. 6A to 6E are partial simplified cross-section views illustrating different steps of a manufacturing method according to the present invention of the component of FIG. 4.

FIG. 6A shows a heavily-doped silicon substrate (N$^+$) 50 supporting a more lightly doped layer (N) 51. Layer 51 results, for example, from an epitaxial growth.

Trenches 52 are dug into layer 51 according to a pattern defined by a mask formed, for example, of a silicon oxide layer 53. In the considered example, trenches 52 are dug down to a depth smaller than the thickness of layer 51.

Figure 6B:
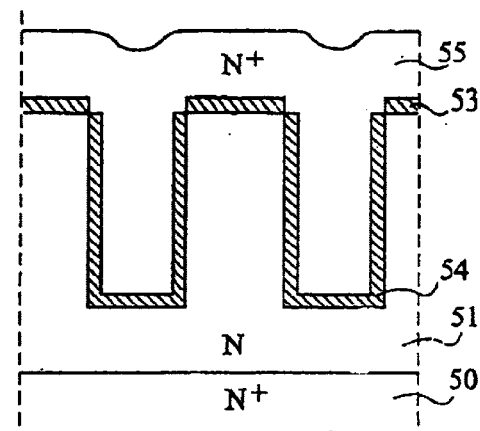

At the next steps, the result of which is illustrated in FIG. 6B, the walls and the bottom of trenches 52 are coated with an insulating layer 54. Preferably, insulating layer 54 results from an oxidation of the semiconductor of the walls and of the bottom of trenches 52. Then, a conductive layer 55, for example, N-type heavily-doped polysilicon, is deposited.

Figure 6C:
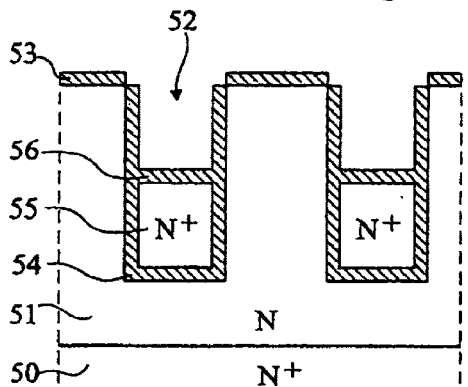

At the next steps, the result of which is illustrated in FIG. 6C, layer 55 is etched to be removed from the upper surface of the structure. Layer 55 is also etched back in trenches 52 to be only partially removed from trenches 52. The bottom of trench 52, that is, the upper surface of the remaining elements of layer 55, is then coated with an insulating layer 56. Layer 56 preferably is a silicon oxide layer resulting from a thermal oxidation.

Figure 6D:
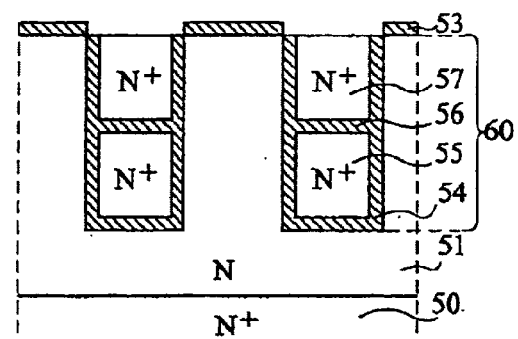

At the next steps, the result of which is illustrated in FIG. 6D, a conductive layer (N$^+$) 57 is deposited again. Layer 57 is deposited to completely fill trenches 52. Preferably, the conductive material forming layer 57 is identical to the material forming layer 55, for example, heavily-doped N-type polysilicon. Then, layer 57 is etched to be removed outside of trenches 52. Multiple-layers 60 formed of conductive elements 55 and 57 separated from each other by insulating layer 56 and from peripheral and underlying layer 51 by insulating layer 54 have thus been formed in layer 51.

Figure 6E:
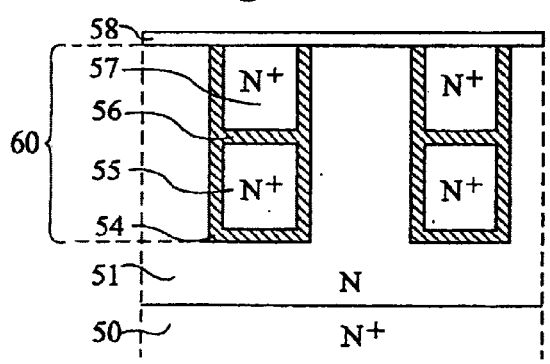

At the next steps, the result of which is illustrated in FIG. 6E, insulator 53 is removed and a metal layer 58 capable of forming a Schottky interface with the apparent portion of layer 51 separating two multiple-layers 60 is deposited. Preferably, the Schottky interface is formed by causing the forming of a silicide layer.

Then, the method ends with conventional steps of the forming of a Schottky diode, for example, the forming of an anode metallization over the entire structure and the forming of a cathode metallization at the rear surface.

Figure 2:
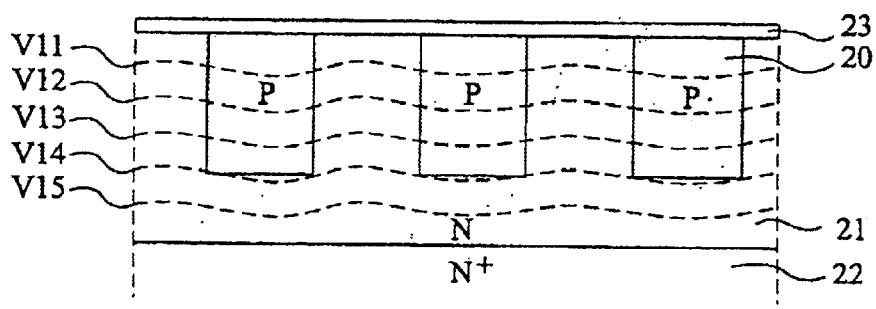
FIG. 2, previously described, is a partial simplified cross-section view of another conventional unipolar component.
Figure 3:
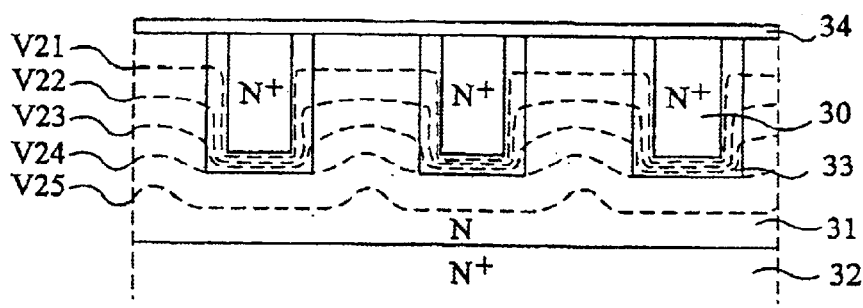
FIG. 3 previously described, is a partial simplified cross-section view of another conventional unipolar component.

A component according to the present invention is simpler to form than the structure of FIG. 2.

Breakdown risks of a unipolar component according to the present invention are all the more reduced as the multiple-layers formed in the insulated trenches comprise a high number of insulated conductor elements. Indeed, when the number of insulated elements increases, the number of equipotential surfaces likely to cross the multiple-layers with a reduced curvature increases. It is then possible to increase the applicable reverse voltage.

It should be clear to those skilled in the art that multiple-layers formed of more than two elements could be formed with the method of FIGS. 6A to 6E, for example, by repeating the steps described in relation with FIGS. 6B and 6C.

Figure 7:
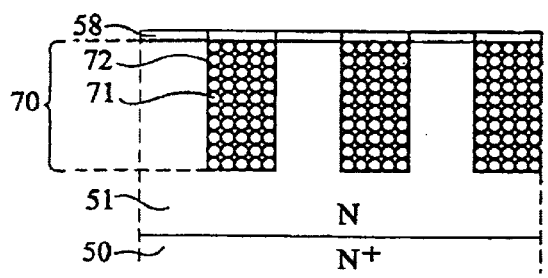
FIG. 7 is a partial simplified cross-section view of another embodiment of a unipolar component according to the present invention.

FIG. 7 illustrates, in a partial simplified cross-section view, the result of a method for forming a unipolar component according to an alternative of the present invention enabling formation, in the trenches of a cathode 51, of multiple-layers 70 formed of a multiplicity of conductive grains 71, each grain being coated with an insulating layer 72.

As compared to the embodiment of FIGS. 6A to 6E, the structure of FIG. 7 is obtained by depositing, after formation of trenches 52, a conductive material in the form of grains 71, each grain being coated with an insulating layer 72. Grains 71 are for example made of N-type heavily-doped polysilicon coated with oxide. This material is known by those skilled in the art as oxygen-doped polysilicon (SIPOX, for Silicium Polycrystalline doped Oxygen).

The resulting structure operates in the same way as that described previously in relation with FIG. 4, but the number of elements being very high, the distribution of the equipotential surfaces is optimized and the reverse breakdown voltage is maximized. The multiple-layers of such a structure are crossed by the equipotential surfaces substantially with no curvature, which enables achieving better performances than those of the structure of FIG. 4. Further, the SIPOX forming is performed in a single step, which is more economical than the method illustrated in FIGS. 6A to 6E.

According to an alternative not shown, the forming of the coated grains of FIG. 7 is preceded with a step comprising coating the lateral walls and the bottom of the trenches with an insulating layer, as described previously in relation with FIG. 6B for layer 54.

The present invention is likely to have various alterations, modifications, and improvements which will readily occur to those skilled in the art. In particular, the cathode layers have previously been considered as being formed by epitaxy on a substrate. They may however be areas specifically doped by diffusion/implantation formed in a solid substrate or epitaxial areas possibly specifically formed in a solid substrate.

Further, the forming, according to the present invention, of unipolar components in an epitaxial layer 51 has been considered as a non-limiting example only. The components could be formed directly in a semiconductor substrate, the rear surface contact, for example of the cathode, being formed in any appropriate manner, for example by forming a heavily-doped buried layer by implantation/diffusion or by epitaxial growth.

Further, it has been considered that the multiple-layers of a structure according to the present invention are formed only in a portion of an upper layer of the substrate. However, the multiple-layers may extend in depth into the entire layer, down to its limit with the contact area formed by the substrate.

Moreover, it will be within the abilities of those skilled in the art to adapt the materials used to a given manufacturing process. Thus, a silicon-based technology has been considered in the foregoing description. However, the present invention applies to the integration of a unipolar component into any semiconductor substrate.

The present invention is not limited to Schottky diodes and to their forming. It also applies to any vertical unipolar structure and to its monolithic forming in a semiconductor substrate. Thus, the present invention enables obtaining MOS-type vertical transistors having a smaller on-state resistance and a higher reverse breakdown voltage in the blocked state. The multiple-layers of conductor elements insulated from one anther and from the peripheral layer are then preferably formed at the level of the transistor sources.

It has also been considered in the foregoing description that the multiple-layers according to the present invention are formed of like conductive elements (single blocks or grains). However, as should be understood by those skilled in the art, it is possible to combine in the multiple-layers of a same component, conductive elements of different shapes, for example by introducing in a structure similar to that of FIG. 4 one or several grain levels similar to those of FIG. 7. Similarly, one or several single blocks similar to those of FIG. 4 may be introduced in a structure similar to that of FIG. 7.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical unipolar component formed in a semiconductor substrate, said component comprising junctions formed at the surface of parts of said substrate separated with insulated trenches extending in an upper portion of the substrate, in which the insulated trenches are filled with a vertical multiple-layer of at least two conductive elements separated by an insulating layer, the multiple-layer depth being, at most, equal to the thickness of said upper portion.

2. The component of claim 1, wherein the multiple-layer depth is equal to the thickness of the upper portion, the insulating layer also separating the elements of a substrate portion underlying the upper portion.

3. The component of claim 1, wherein at least part of the elements are conductive grains.

4. The component of claim 1, wherein at least part of the elements are blocks exhibiting, in top view, a same surface area as the multiple-layer.

5. The component of claim 1, forming a Schottky diode having its cathode corresponding to said upper portion.

6. A vertical unipolar component formed in a semiconductor substrate, the component comprising junctions formed at a surface of regions of the substrate separated by insulated trenches extending in an upper portion of the substrate, wherein the insulated trenches contain at least two conductive elements separated by an insulating layer.

7. The component of claim 6, wherein a depth of the at least two conductive elements separated by an insulating layer is, at most, equal to a thickness of the upper portion.

8. The component of claim 6, wherein the insulating layer also separates elements of a substrate portion underlying the upper portion.

9. The component of claim 6, wherein at least part of the elements are conductive grains.

10. The component of claim 6, wherein at least part of the elements are blocks exhibiting, in top view, a same surface area as one of the trenches.

11. The component of claim 6, forming a Schottky diode having its cathode corresponding to said upper portion.

* * * * *